(12) United States Patent
Schwandner et al.

(10) Patent No.: US 8,647,985 B2
(45) Date of Patent: Feb. 11, 2014

(54) METHOD FOR POLISHING A SUBSTRATE COMPOSED OF SEMICONDUCTOR MATERIAL

(75) Inventors: Juergen Schwandner, Garching (DE); Thomas Buschhardt, Burghausen (DE); Roland Koppert, Triftern (DE); Georg Pietsch, Burghausen (DE)

(73) Assignee: Siltronic AG, Munich (DE)

( * ) Notice: Subject to any disclaimer, the term of this patent is extended or adjusted under 35 U.S.C. 154(b) by 911 days.

(21) Appl. No.: 12/166,486

(22) Filed: Jul. 2, 2008

(65) Prior Publication Data

US 2009/0029552 A1    Jan. 29, 2009

(30) Foreign Application Priority Data

Jul. 27, 2007    (DE) .................. 10 2007 035 266

(51) Int. Cl.
| | |
|---|---|
| *H01L 21/302* | (2006.01) |
| *H01L 21/461* | (2006.01) |
| *C03C 15/00* | (2006.01) |
| *C03C 25/68* | (2006.01) |

(52) U.S. Cl.
USPC ............. 438/692; 216/88; 216/89; 438/690; 438/691; 438/693

(58) Field of Classification Search
USPC ............... 216/88–89; 438/690–693
See application file for complete search history.

(56) References Cited

U.S. PATENT DOCUMENTS

| | | | |
|---|---|---|---|
| 2001/0001756 A1* | 5/2001 | Somekh .................. 451/41 |
| 2001/0005009 A1* | 6/2001 | Tsuchiya et al. .......... 252/79 |
| 2001/0011515 A1* | 8/2001 | Aoki et al. ............. 106/14.42 |
| 2001/0031558 A1* | 10/2001 | Sun et al. .................. 438/690 |
| 2002/0006728 A1* | 1/2002 | Matsui et al. ............. 438/693 |
| 2002/0069967 A1* | 6/2002 | Wright .................. 156/345.12 |
| 2003/0013387 A1* | 1/2003 | Tsai et al. .................. 451/41 |
| 2004/0127045 A1* | 7/2004 | Gorantla et al. ........... 438/690 |
| 2005/0227590 A1 | 10/2005 | Sung |
| 2006/0046623 A1* | 3/2006 | Wang et al. .............. 451/56 |
| 2006/0218867 A1* | 10/2006 | Koshiyama et al. ........... 51/308 |
| 2007/0037343 A1* | 2/2007 | Colombo et al. ........... 438/231 |
| 2008/0038995 A1* | 2/2008 | Small et al. ................ 451/37 |
| 2008/0265375 A1* | 10/2008 | Pietsch et al. .............. 257/616 |

FOREIGN PATENT DOCUMENTS

| | | | | |
|---|---|---|---|---|
| EP | 1050369 A2 * | 11/2000 | .......... B24B 7/22 |
| EP | 1717001 A1 | 11/2006 | |
| JP | 2000315665 A | 11/2000 | |
| JP | 2001135605 A | 5/2001 | |
| JP | 2001244221 A | 9/2001 | |
| JP | 2001291720 A | 10/2001 | |
| JP | 2002512894 A | 5/2002 | |
| JP | 2003-249466 A | 9/2003 | |
| JP | 2003-260663 A | 9/2003 | |
| JP | 2006-278981 A | 10/2006 | |
| JP | 2007-095840 A | 4/2007 | |
| WO | 92/13680 A1 | 8/1992 | |
| WO | 99/55491 | 11/1999 | |
| WO | 03/074228 A1 | 9/2003 | |

OTHER PUBLICATIONS

English Machine Translation of JP 2002-512894.*

* cited by examiner

*Primary Examiner* — Allan Olsen
*Assistant Examiner* — Margaret D Klunk
(74) *Attorney, Agent, or Firm* — Brooks Kushman P.C.

(57) ABSTRACT

Semiconductor material substrates are polished by a method including at least one polishing step A by means of which the substrate is polished on a polishing pad containing an abrasive material bonded in the polishing pad and a polishing agent solution is introduced between the substrate and the polishing pad during the polishing step; and at least one polishing step B by means of which the substrate is polished on a polishing pad containing an abrasive material-containing polishing pad and wherein a polishing agent slurry containing unbonded abrasive material is introduced between the substrate and the polishing pad during the polishing step.

13 Claims, No Drawings

METHOD FOR POLISHING A SUBSTRATE COMPOSED OF SEMICONDUCTOR MATERIAL

BACKGROUND OF THE INVENTION

1. Field of the Invention

The invention relates to a method for polishing a substrate composed of semiconductor material, comprising at least two steps. One step is a polishing step by means of which the substrate is polished on a polishing pad containing an abrasive material bonded in the polishing pad.

2. Background Art

WO 99/55491 A1 describes a two-stage polishing method, comprising a first polishing step, in which the substrate is polished on a polishing pad containing an abrasive material bonded in the polishing pad. A polishing step in which such a polishing pad—also called "fixed-abrasive pad"—is used is referred to hereinafter as "FAP" step for short. The subsequent second polishing step of the two-stage polishing method is a chemical mechanical polishing of the substrate on a polishing pad containing no bonded abrasive material. Abrasive material is introduced in the form of a slurry between the substrate and the polishing pad. Such a polishing step is referred to hereinafter as a "CMP" step for short. CMP is used in the two-stage polishing method of WO 99/55491 A1 in particular to eliminate scratches left by the FAP step on the polished surface of the substrate.

EP 1 717 001 A1 is one example where FAP steps are used when polishing semiconductor wafers which have not yet had any component structures formed upon their surface. During the polishing of such semiconductor wafers, it is primarily important to produce at least one lateral surface which is particularly planar and which has a minimal microroughness and nanotopography.

SUMMARY OF THE INVENTION

An object of the present invention is to specify an improved polishing method for substrates composed of semiconductor material, which provides polished surfaces with particularly low values of microroughness. These and other objects are achieved by means of a method for polishing a substrate of semiconductor material, comprising at least one polishing step A wherein the substrate is polished on a polishing pad containing an abrasive material bonded in the polishing pad, wherein a polishing agent solution is introduced between the substrate and the polishing pad during the polishing step; and at least one polishing step B, wherein the substrate is polished on a polishing pad containing an abrasive material bonded in the polishing pad, wherein a polishing agent slurry containing unbonded abrasive material is introduced between the substrate and the polishing pad during the polishing step.

DETAILED DESCRIPTION OF THE PREFERRED EMBODIMENT(S)

The polishing steps A and B are in each case an FAP step. They differ in that in the polishing step B a polishing agent slurry containing unbonded solid abrasive material is introduced between the substrate and the polishing pad, while in the polishing step A, the polishing agent slurry is replaced by a polishing agent solution which, as the name indicates is free of abrasive solids. The expression "polishing agent" is used hereafter as a generic term for polishing agent slurries and polishing agent solutions.

The proportion of abrasive material in the polishing agent slurry is preferably 0.25 to 20% by weight. The size distribution of the abrasive material particles is preferably monomodal in nature. The average particle size is preferably 5 to 300 nm, more preferably 5 to 50 nm. The abrasive material comprises a material that mechanically removes the substrate material, preferably one or more of the oxides of the elements aluminum, cerium or silicon. A polishing agent slurry containing colloidally disperse silicic acid is particularly preferred. The pH of the polishing agent slurry preferably lies within a range of 9 to 11.5 and is preferably set by additives such as sodium carbonate ($Na_2CO_3$) potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures of these compounds. The polishing agent slurry can furthermore contain one or more further additives, for example surface-active additives such as wetting agents and surfactants, stabilizers acting as protective colloids, preservatives, biocides, alcohols and complexing agents.

The polishing agent solution is water in the simplest case, preferably deionized water (DIW) having the customary purity for use in the semiconductor industry. However, the polishing agent solution can also contain compounds such as sodium carbonate ($Na_2CO_3$) potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. In this case, the pH of the polishing agent solution preferably lies within a range of 10 to 12, and the proportion of the compounds mentioned in the polishing agent solution is preferably 0.01 to 10% by weight. The polishing agent solution can furthermore contain one or more further additives, for example surface-active additives such as wetting agents and surfactants, stabilizers acting as protective colloids, preservatives, biocides, alcohols and complexing agents.

Suitable substrates which are polished according to the invention include, in particular, semiconductor wafers composed of materials such as silicon, gallium arsenide, $Si_xGe_{1-x}$, sapphire and siliconcarbide. Particularly suitable substrates are semiconductor wafers composed of silicon and substrates derived therefrom. The surface of a silicon semiconductor wafer silicon to be polished can be present in a state which arises after the separation of the semiconductor wafer from a crystal, after lapping of the semiconductor wafer, after grinding of the semiconductor wafer, after etching of the semiconductor wafer or after a semiconductor wafer polishing that has already been effected. A substrate derived from a semiconductor wafer composed of silicon should be understood to mean, in particular, substrates having a layer structure, for example semiconductor wafers having a layer deposited by means of epitaxy, SOI substrates ("silicon on insulator") and sSOI substrates (strained silicon on insulator) and intermediate products thereof. The intermediate products also include donor semiconductor wafers from which layers have been transferred to other substrates, in particular in the course of producing SOI substrates. In order to be able to be reused, the surface of the donor semiconductor wafer that is uncovered by the layer transfer, said surface being comparatively rough and having a characteristic step in the edge region, has to be smoothed. The surfaces to be polished of the substrates need not or not only consist of silicon. By way of example, layers composing III-V compound semiconductor such as gallium arsenide or an alloy composed of silicon and germanium ($Si_xGe_{1-x}$) may be involved. Further examples are layers composed of indium phosphide, gallium nitride and aluminum gallium arsenide. The surface of $Si_xGe_{1-x}$ layers is often characterized by a pattern caused by dislocations and known as "cross hatch", and must generally be smoothed before one or more further layers can be deposited thereon.

If substrates with layers of germanium or $Si_xGe_{1-x}$ are to be polished according to the invention, the polishing agent slurry or the polishing agent solution or both can contain an oxidizing agent as further additive. Suitable oxidizing agents are hydrogen peroxide ($H_2O_2$) and ozone ($O_3$). The additive converts germanium into a water-soluble compound. Without the additive, germanium-containing particles can arise in the course of polishing and can scratch the polished surface.

The method of the invention can be carried out in the form of a double-side polishing, in principle. In this case, both sides of a semiconductor wafer are polished simultaneously. A particularly suitable area of application is single-side polishing, however. In this case, substrates having a large diameter, for example semiconductor wafers composed of silicon having a diameter of 300 mm, are usually polished singly. With the aid of a polishing head, they are pressed with the lateral surface to be polished against the polishing pad, while lying on a polishing plate. A polishing head also includes a retainer ring that laterally encloses the substrate and prevents it from sliding from the polishing head during polishing. In the case of modern polishing heads, the lateral surface of the semiconductor wafer which is remote from the polishing pad bears on an elastic membrane that transmits the polishing pressure exerted. The membrane is part of a possibly subdivided chamber system that forms a gas or liquid cushion. However, polishing heads are also in use in which an elastic support ("backing pad") is used instead of a membrane. The substrate is polished with the feeding of a polishing agent between the substrate and the polishing pad and with rotation of the polishing head and of the polishing plate. In this case, the polishing head can initially also be moved translationally over the polishing pad, whereby more comprehensive use of the polishing pad area is obtained.

Furthermore, the method of the invention can also be carried out on single-plate and multi-plate polishing machines. The use of multi-plate polishing machines having preferably two or three polishing plates and polishing heads is preferred, such that a corresponding number of substrates can be polished simultaneously. Different polishing pads and different polishing agents can also be used in this case.

The inventive method uses at least one polishing pad containing an abrasive material bonded in the polishing pad. Suitable abrasive materials comprise for example particles of oxides of the elements cerium, aluminum, silicon, zirconium and particles of hard materials such as silicon carbide, boron nitride and diamond. Particularly suitable polishing pads have a surface topography shaped by replicated microstructures. These microstructures ("posts") may have, for example, the form of columns having a cylindrical or polygonal cross section or the form of pyramids or truncated pyramids. Polishing pads of this type are commercially available and offered for example by 3M Corp., USA. More detailed descriptions of such polishing pads are contained for example in WO 92/13680 A1 and US 2005/227590 A1.

The inventive method comprises at least one polishing step A and one polishing step B. An FAP pad is used in both polishing steps. This may involve the same polishing pad, or different polishing pads. In accordance with a particularly preferred embodiment, polishing is temporally subdivided into at least three substeps 1, 2 and 3, wherein process parameters that control the mean material removal (MR), such as polishing agent, polishing agent flow rate and polishing step duration, for example, are controlled in such a way that a mean material removal results which in substep 1 is greater than that in substep 2, and in substep 2 it is greater than or equal to that in substep 3. Of substeps 1, 2 and 3, at least one substep is configured as a polishing step A and at least one substep is configured as a polishing step B. Substep 1 is preferably embodied as a polishing step A, substep 2 preferably as a polishing step B, and substep 3 either as a polishing step A or as a polishing step type B.

The method according to the invention can comprise further polishing steps, for example a CMP step, which is referred to here as a polishing step C. Such a polishing step is preferably carried out after a polishing step A or B. Furthermore, the substrate can be etched or cleaned, for example using an alkaline etchant and/or using an etchant having an acidic pH, after a polishing step A or B.

Reduction of microroughness can be assisted or improved by accompanying measures. One preferred measure consists in reducing the polishing pressure by at least 10% in an end phase of the polishing, preferably 5 to 300 s before the substrate is raised from the polishing plate, and continuing to polish the substrate at this reduced polishing pressure until lift-off from the polishing plate. A further preferred measure consists in cleaning the polishing pad using a cleaning agent, by distributing the cleaning agent on the polishing pad with the aid of an open-pored foam body. This is preferably done in situ, that is to say during the polishing of the substrate. The pad cleaning differs from pad conditioning by virtue of the fact that the foam body does not contain any abrasive materials bonded thereto. In principle, any elastic plastic foam having an open cell structure is suitable, for example polyurethane foams, polyvinyl alcohol foams, polystyrene foams, silicone foams, epoxy foams, urea-formaldehyde foams, polyimide foams, polybenzimidazole foams, foams based on phenolic resins, polyethylene foams, polypropylene foams, polyacrylic foams, polyester foams and viscose foams. The polishing agent used in the respective polishing step is suitable, in particular, as a cleaning agent.

The invention is explained in more detail below using the example of preferred exemplary embodiments and its advantageous effect with regard to the reduction of microroughness is set out by means of comparative experiments.

The substrates were semiconductor wafers composed of silicon having a diameter of 300 mm and having an upper layer composed of a relaxed silicon-germanium alloy having the composition $Si_{0.8}Ge_{0.2}$. They were polished on a single-side polishing machine from Strasbaugh, Inc. of type nHance 6EG and were subsequently cleaned, dried and passed to a stage for examining the polished surface. The individual-wafer polishing machine configured in particular for development work is equipped with one polishing head and with one polishing plate. The polishing head is mounted cardanically and comprises a fixed baseplate coated with a backing pad, and a movable retainer ring. Through holes in the baseplate, cushions can be established in two concentric pressure zones, an inner and an outer zone, the substrate floating on said air cushions during polishing. Pressure can be applied to the movable retainer ring by means of compressed air bellows in order thus to pretension the polishing pad upon contact with the substrate and to keep it plane. For the comparative examples and exemplary embodiments, an FAP pad from 3M Corp., USA, was used, having abrasive particles of cerium oxide ($CeO_2$) bonded therein and having an average grain size of 0.55 μm.

In a first series of experiments, both the semiconductor wafers of the first comparative example and the semiconductor wafers of the first exemplary embodiment was subjected to a three-stage polishing method, polishing steps 1, 2 and 3. In the case of the comparative examples, polishing steps 1, 2 and 3 were without exception polishing steps of type A. In contrast thereto, the semiconductor wafers of the exemplary embodiments were subjected to a corresponding polishing in which polishing steps 2 and 3 were polishing steps of type B.

Further experiment parameters are summarized in the following table.

TABLE 1

|  | Exemplary embodiment | Comparative example |
|---|---|---|
| Polishing step 1 |  |  |
| Type | A | A |
| Polishing agent | $K_2CO_3$ solution (0.2% by weight $K_2CO_3$ proportion) | $K_2CO_3$ solution (0.2% by weight $K_2CO_3$ proportion) |
| Polishing agent flow rate | 3000 ml/min | 3000 ml/min |
| Duration | 60 to 300 s | 60 to 300 s |
| Polishing pressure | 7 psi (48.26 kPa) | 7 psi (48.26 kPa) |
| Polishing step 2 |  |  |
| Type | B | A |
| Polishing agent | Glanzox 3900*) (1% by weight $SiO_2$ proportion) | DIW |
| Polishing agent flow rate | 350 ml/min | 350 ml/min |
| Duration | 120 s | 120 s |
| Polishing pressure | 7 psi (48.26 kPa) | 7 psi (48.26 kPa) |
| Polishing step 3 |  |  |
| Type | B | A |
| Polishing agent | Glanzox 3900*) (1% by weight $SiO_2$ proportion) | DIW |
| Polishing agent flow rate | 350 ml/min | 350 ml/min |
| Duration | 10 s | 10 s |
| Polishing pressure | 3.5 psi (24.13 kPa) | 3.5 psi (24.13 kPa) |

*)Glanzox 3900 is the product name for a polishing agent slurry offered by Fujimi Incorporated, Japan, as a concentrate. The concentrate having a pH of 10.5 contains approximately 9% by weight of colloidal $SiO_2$ having an average particle size of 30 to 40 nm. The $SiO_2$ proportion indicated in the table is based on the polishing agent.

After polishing, the semiconductor wafers were cleaned, dried and examined with regard to the residual microroughness. Three different measuring methods were employed in this case. The RMS roughness ("root mean square, RMS") was determined using a phase contrast profilometer of the MP2000 type from Chapman Instruments, USA, taking account of various lateral correlation lengths (filter lengths, "spatial wavelengths") that influence the roughness value. Furthermore, dark field scattered light ("haze") was measured using a Surfscan SP-1 from KLA-Tencor, USA, for various detector arrangements (channel mode: D="dark field"; N="narrow", W="wide"; O="oblique", N="normal"). The third measurement was an AFM measurement ("atomic force microscopy", AFM) on a square measurement area of 10 µm×10 µm in the center and 1 mm from the edge of the semiconductor wafers, which is likewise used for determining the RMS roughness.

The results of the measurements are summarized in tables 2, 3 and 4.

TABLE 2

| Chapman | Polishing step Duration(s) | RMS roughness [Angström] | | | | MR [nm] |
|---|---|---|---|---|---|---|
| Filter length [µm] |  | 250 | 80 | 30 | 10 |  |
| Exemplary embodiment 1 | 60 | 1.17 | 0.81 | 0.51 | 0.19 | 210 |
| Exemplary embodiment 1 | 150 | 1.13 | 0.79 | 0.49 | 0.18 | 280 |
| Exemplary embodiment 1 | 270 | 0.92 | 0.61 | 0.38 | 0.15 | 450 |
| Exemplary embodiment 2 | 270 | 0.72 | 0.45 | 0.27 | 0.11 | 420 |
| Comparative example 1 | 60 | 11.59 | 8.92 | 5.47 | 1.78 | 190 |
| Comparative example 1 | 160 | 7.69 | 5.62 | 3.28 | 1.07 | 270 |
| Comparative example 1 | 300 | 5.79 | 4.24 | 2.47 | 0.80 | 460 |
| Comparative example 2 | 300 | 3.97 | 3.05 | 1.92 | 0.66 | 520 |

TABLE 3

| SP-1 | Polishing step 1 Duration(s) | "Haze" [ppm] | | | |
|---|---|---|---|---|---|
| Channel mode |  | DWN | DNN | DWO | DNO |
| Exemplary embodiment 1 | 60 | 0.588 | 0.836 | 0.369 | 0.047 |
| Exemplary embodiment 1 | 150 | 0.508 | 0.704 | 0.329 | 0.039 |
| Exemplary embodiment 1 | 270 | 0.384 | 0.487 | 0.275 | 0.032 |
| Exemplary embodiment 2 | 270 | 0.326 | 0.264 | 0.225 | 0.020 |
| Comparative example 1 | 60 | 1.497 | 4.712 | 1.405 | 0.134 |
| Comparative example 1 | 160 | 1.346 | 4.391 | 1.061 | 0.117 |
| Comparative example 1 | 300 | 1.127 | 3.947 | 0.800 | 0.099 |
| Comparative example 2 | 300 | 1.005 | 3.582 | 0.706 | 0.094 |

TABLE 4

| AFM | Polishing step 1 Duration(s) | RMS roughness [Angström] | |
|---|---|---|---|
| Position |  | Center | Edge-1 mm |
| Exemplary embodiment 1 | 60 | 1.25 | 1.11 |
| Exemplary embodiment 1 | 150 | 1.24 | 1.08 |
| Exemplary embodiment 1 | 270 | 1.05 | 0.93 |
| Exemplary embodiment 2 | 270 | 0.98 | 0.77 |
| Comparative example 1 | 60 | 3.72 | 2.23 |
| Comparative example 1 | 160 | 2.06 | 1.69 |
| Comparative example 1 | 300 | 2.22 | 1.50 |
| Comparative example 2 | 300 | 1.81 | 1.35 |

The tables show that significantly lower "haze" and RMS roughness values can be expected if polishing is effected according to the invention.

The above experiments in the first series of experiments (exemplary embodiment 1 and comparative example 1) were carried out without in-situ cleaning of the polishing pad. In a second series of experiments (exemplary embodiment 2 and comparative example 2), further semiconductor wafers of the same type were polished in the same way, except that in-situ cleaning of the polishing pad was additionally carried out using an open-pored sponge composed of polyester that was impregnated with the polishing agent as cleaning agent. The rows in tables 2, 3 and 4 that indicate these experiments make it clear that the microroughness was able to be reduced further by means of this additional measure.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for polishing a SiGe alloy layer on a surface of a silicon substrate, the method comprising: starting polishing by first polishing the SiGe alloy layer by at least one polishing step A, wherein the SiGe alloy layer is polished on a polishing pad containing bonded abrasive material, and wherein a polishing agent solution free of abrasive particles is introduced between the SiGe alloy layer and the polishing pad during polishing step A; and at least one polishing step B wherein the SiGe alloy layer which has been subjected to a polishing step A is polished on a polishing pad containing a bonded abrasive material, wherein a polishing agent slurry containing unbonded abrasive material is introduced between the SiGe alloy layer and the polishing pad during polishing step B, and wherein the polishing agent solution, the polishing agent slurry, or both the polishing agent solution and the polishing agent slurry comprises hydrogen peroxide or ozone as additive(s), thereby converting germanium into a water soluble compound.

2. The method of claim 1, wherein polishing step B is performed at a first pressure, and prior to the conclusion of polishing step B the pressure is lowered to a second pressure.

3. The method of claim 2, wherein a polishing step A and a polishing step B are performed on the same polishing plate.

4. The method of claim 2, wherein a polishing step A and a polishing step B are performed on different polishing plates.

5. The method of claim 2, further comprising at least one polishing step C wherein the SiGe alloy layer is polished by means of a polishing pad having no bonded abrasive material, and a polishing agent slurry containing unbonded abrasive material is introduced between the SiGe alloy layer and the polishing pad during the polishing step.

6. The method of claim 1, wherein a polishing step A and a polishing step B are performed on the same polishing plate.

7. The method of claim 1, wherein a polishing step A and a polishing step B are performed on different polishing plates.

8. The method of claim 1, further comprising at least one polishing step C wherein the SiGe alloy layer is polished by means of a polishing pad having no bonded abrasive material, and a polishing agent slurry containing unbonded abrasive material is introduced between the SiGe alloy layer and the polishing pad during the polishing step.

9. The method of claim 1, wherein the polishing agent slurry contains one or more oxides of the elements aluminum, cerium or silicon as an abrasive material.

10. The method of claim 9, wherein the polishing agent slurry has a solids content of 0.25 to 20% by weight.

11. The method of claim 1, wherein the polishing pad is cleaned during a polishing step by distributing a cleaning agent being on the polishing pad with the aid of an open-pored foam body.

12. The method of claim 1, wherein the SiGe alloy layer is etched or cleaned after a polishing step A or B or after both such polishing steps.

13. The method of claim 1, wherein the additive for converting germanium into a water-soluble compound is ozone.

\* \* \* \* \*